United States Patent [19]

Barta

[11] 4,249,133

[45] Feb. 3, 1981

[54] ELECTROLUMINESCENT CATHODE RAY STORAGE TUBE

[75] Inventor: Gary S. Barta, Portland, Oreg.

[73] Assignee: Tektronix, Inc., Beaverton, Oreg.

[21] Appl. No.: 922,950

[22] Filed: Jul. 10, 1978

[51] Int. Cl.³ ........................ G11C 11/23; G11C 11/26

[52] U.S. Cl. .................................... 328/123; 328/126; 313/398; 313/463; 313/473; 315/8.5

[58] Field of Search ........................ 328/123, 124, 126; 340/720, 794, 797; 313/397, 398, 473; 315/12 R, 8.5; 313/391, 463

[56] References Cited

U.S. PATENT DOCUMENTS

| | | | |
|---|---|---|---|
| 3,344,300 | 9/1967 | Lehrer et al. | 313/463 |
| 3,683,358 | 8/1972 | Eichelberger | 340/720 X |
| 3,825,791 | 7/1974 | Kazan | 313/398 |
| 3,896,328 | 7/1975 | Potter | 313/463 |
| 3,908,148 | 9/1975 | Lehrer et al. | 313/398 |
| 4,149,108 | 4/1979 | Chang | 313/397 X |

*Primary Examiner*—John Zazworsky

[57] ABSTRACT

A direct view cathode ray storage tube utilizes a thin film electroluminescent layer as a part of the target structure so that the electron beam writes information on the phosphor layer and written areas of the phosphor layer activate corresponding areas of the electroluminescent layer so that these areas are illuminated thereby visibly displaying such information which are stored by the electroluminescent layer so long as sustain pulses are applied thereto. Selective erasure of the written displayed information can also be accomplished.

9 Claims, 7 Drawing Figures

ELECTROLUMINESCENT CATHODE RAY STORAGE TUBE

BACKGROUND OF THE INVENTION

The display of information via electroluminescent panels is a known concept. C. Suzuki et al are authors of two articles that appear on pages 50–53 of the SID 1976 Digest which are titled: "Character Display using Thin-Film EL Panel with Inherent Memory" and "Optical Writing on a Thin-Film EL Panel with Inherent Memory." The first article covers the concept of providing a grid matrix of conductive members in combination with a thin-film electroluminescent panel which will display information in accordance with the selective operation of the conductive members when writing pulses are applied thereto. This information will be stored due to the application of sustaining pulses to the stored information and erasure occurs when erase pulses are applied to the conductive members. The second article is directed to the use of light to write and store information on an electroluminescent panel of the type disclosed in the first article.

U.S. Pat. No. 3,896,328 to Potter discloses a cathode ray tube that uses a dual phosphor screen which comprises a phosphor target on the inside surface of a glass faceplate and a photoluminescent panel constructed of a layer of photoconductive material and a layer of electroluminescent material is placed on the outside surface of the faceplate. This structure will not store information that has been visibly displayed.

U.S. Pat. No. 3,344,300 to Lehrer et al covers the concept of applying an electron beam of a cathode ray tube to a field-sustained conductivity layer thereby increasing conductivity of areas engaged by the electron beam and voltage applied across an electroluminescent layer adjacent the field-sustained conductivity layer will be increased and luminance will occur at locations of the electroluminescent layer corresponding to electron beam-activated areas of the field-sustained conductivity layer to display such information. No storage of this displayed information will take place either. Conventional storage cathode ray tubes are also known but these require flood guns, their contrast ratio is not very high, brightness of displayed information is a problem and operating life is not as long as desired.

SUMMARY OF THE INVENTION

The present invention relates to cathode ray tubes and more particularly to cathode ray storage tubes employing a thin-film electroluminescent structure.

The present invention is realized by a unique target structure that is secured onto a glass faceplate and is part of a cathode ray tube including an electron gun and deflection means for orthogonally directing the electron beam from the electron gun over the target structure. The target structure comprises a phosphor layer which is engaged thereover by the electron beam to write thereon information dictated by the deflection means. A thin-film electroluminescent structure having transparent conducting layers on front and rear surfaces thereof is disposed between the faceplate and the phosphor layer. By appropriate timing of the electron gun with AC voltage applied to the transparent conducting layers, the emitted light from the phosphor layer will photopolarize or photorelax the electroluminescent layer such that the created internal electric field in the electroluminescent layer will add or subtract from the external applied field thereby causing the electroluminescent layer to emit light or extinguish emitted light respectively.

An object of the present invention is to provide a direct view cathode ray storage tube which utilizes an electroluminescent structure to display and store information written on a phosphor layer by an electron beam.

Another object of the present invention is the provision of a storage target including an electroluminescent structure and a phosphor layer with transparent conductive layers on each side of the electroluminescent structure.

A further object of the present invention is to provide an electroluminescent storage cathode ray tube for storing information which can be selectively erased or written.

An additional object of the present invention is the provision of an electroluminescent storage cathode ray tube that has high contrast ratio, longer life and increased brightness.

The foregoing and other objects, features and advantages of the invention will be apparent from the following more particular description of a preferred embodiment of the invention as illustrated in the accompanying drawing.

DETAILED DESCRIPTION OF THE INVENTION

Figure 1:
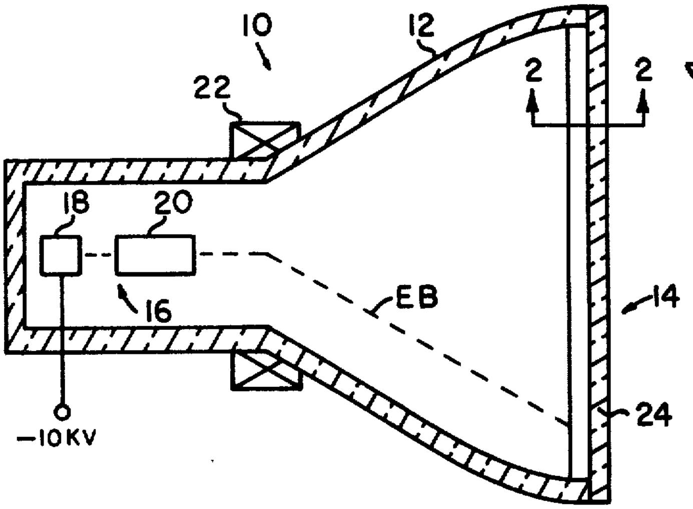
FIG. 1 is a cross section of an electroluminescent cathode ray storage tube in accordance with the present invention.
Figure 2:
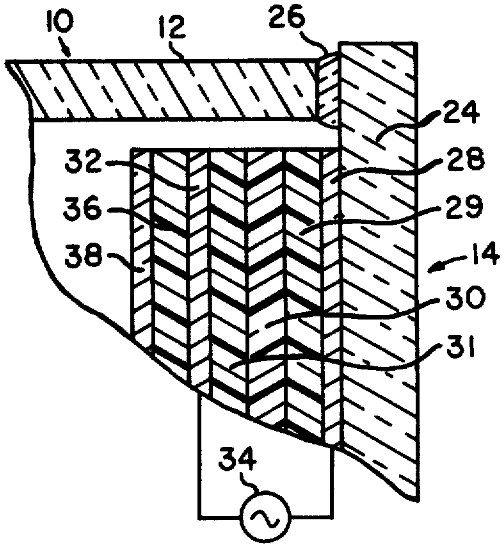
FIG. 2 is an enlarged cross sectional view taken along lines 2—2 of FIG. 1.

FIGS. 1 and 2 illustrate a preferred embodiment of a cathode ray storage tube 10 which has a conventional configuration in the form of an envelope 12 including a storage target 14 sealingly secured to a funnel section of envelope 12.

Envelope 12 with storage target 14 secured thereto is under vacuum and envelope 12 can be made of glass or the funnel section can be made of ceramic and the neck section made of glass. A writing gun 16 is positioned in the neck section of envelope 12 and it includes a cathode 18 connected to a suitable voltage of −4KV to −10KV. Cathode 18 emits an electron beam EB that is passed through focussing element 20 and the focussed electron beam is deflected by the vertical and horizontal fields created by a conventional magnetic deflection system 22 that is mounted on the neck section of the cathode ray tube at the junction of the neck and funnel sections. Magnetic deflection system 22 deflects electron beam EB over the surface of storage target 14 in accordance with deflection signals being applied to deflection system 22. Of course electrostatic deflection means can be used if desired.

Storage target 14 as best illustrated in FIG. 2 is made of a transparent glass faceplate 24 which is secured to the funnel section of envelope 10 via a conventional frit seal 26. A thin transparent conductive coating 28 of preferrably tin oxide or indium tin oxide is applied onto the inside surface of faceplate 24. A thin layer 29 of insulating material is located on conductive coating 28 and it is preferrably yttruim oxide but other insulating materials such as silicon nitride, aluminum oxide or barium titinate can also be used. A thin layer 30 of electroluminescent material is disposed between insulating layer 29 and another layer of insulating material 31 which is the same as insulating layer 29. Electroluminescent layer 30 is preferrably zinc sulfide activated by manganese. Electroluminescent phosphor materials that can be suitable for use in cathode ray tubes are described by W. A. Thornton, Journal of Applied Physics (1959) Vol. 30, pg. 123. It is necessary that the electroluminescent material have brightness versus voltage hysteresis characteristics to provide the intrinsic memory effect. Each electroluminescent material will have its own hysteresis characteristics and this can be varied in accordance with the doping material that has been added thereto.

Another thin layer 32 of transparent conductive material that is transparent to UV is located on the inner surface of electroluminescent structure 29, 30 and 31. The electroluminescent structure can be manufactured in the manner disclosed in an article titled "Memory Effect in EL Devices Points way to New Usages" by T. Inoguchi et al, JEE, October 1976, pages 30–33.

An A.C. voltage is applied via A.C. source 34 to conductive layers 28 and 32. A layer 36 of phosphor material that emits UV light in the region optimum for photopolarization of electroluminescent layer 30 is deposited onto conductive layer 32 and it will emit ultraviolet light from the areas that are engaged by electron beam EB. Examples of such phosphor material are P16, P18 (BA FCl: Eu, or Ba Meso-SiO4: Pb). If desired a thin layer of metal 38 can be provided on the inner surface of phosphor layer 36 to prevent back scattering of the UV light that is created by engagement of the electron beam on phosphor layer 36. Metal layer 38 is preferrably aluminum and it is thin enough so that electrons of electron beam EB penetrate it and engage the underlying phosphor layer 36 to activate it. Typical thicknesses of the layers of material that form the storage target are as follows:

| | |
|---|---|
| Layers 28 and 32 | 4000–6000 Angstroms |
| Layers 29 and 31 | 2650 Angstroms |
| Layer 30 | 4000 Angstroms |
| Layer 36 | 10–15 Microns |
| Layer 38 | 600 Angstroms |

Layer 32 can be aluminum, and, if that is the case, the thickness of the aluminum layer will be 100 angstroms to make it transparent to light from phosphor layer 36. A.C. source 34 generates sustain pulses 40, FIG. 3 at a frequency of 60 Hz. to 5 KHz. and they are applied to conductive layers 28 and 32. The frequency and configuration of the sustain pulses will be determined by the size of the display area of the storage target. The sustain pulse amplitude is adjusted such that it is between the turn-on and turn-off threshold voltages on the electroluminescent output brightness versus applied voltage magnitude curve. Placing the sustain pulse amplitude closer to the turn-off threshold results in lower output brightness but higher contrast ratio. Conversely, increasing the sustain pulse amplitude nearer to the turn-on threshold results in increased output brightness but lower contrast ratio. Sustain pulses 40 will maintain electroluminescent layer 30 in the ready to write state or written state.

Furthermore, layer 31 can be a dielectric as described but activated such that it also functions as a UV-emitting material, and, if that is the case, conducting layer 32 can be 600 angstroms of aluminum functioning as layers 32 and 38 since it need not be transparent to light. The afore mentioned layers 36 and 38 are omitted since the function of layer 36 has been combined into layer 31 and, likewise, the function of layer 38 has been combined into layer 32. Operation of the device by electron gun 16 and A.C. source 34 remains unchanged.

Figure 3:
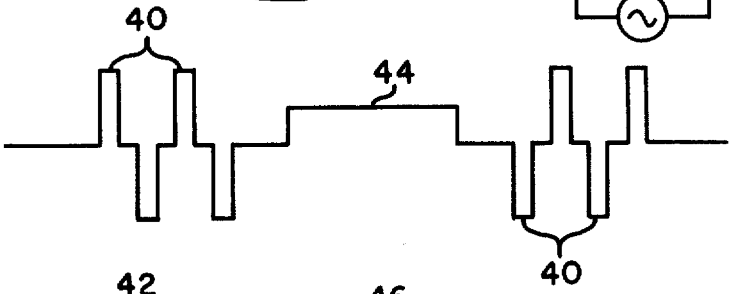
FIGS. 3–7 illustrate various waveforms that are used to operate the cathode ray storage tube of the present invention.
Figure 4:
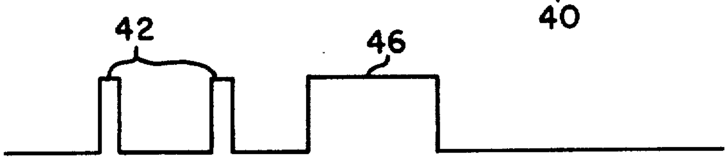

Activation of the electron gun 16 during the time that sustain pulses 40 occur as shown by pulses 42, FIG. 4 or during the time a polarization pulse 44, FIG. 3 occurs as shown by pulse 46, FIG. 4 will cause electron beam EB to be deflected over phosphor layer 36 under the control of deflection system 22 to write information thereon. Light generated from the written areas of phosphor layer 36 will be transmitted through transparent conductive layer 32 into corresponding areas of electroluminescent layer 30 and these corresponding areas will be activated by the UV component thereby emitting light therefrom to visibly display the written information. The written information will continue to be displayed in a stored condition so long as sustain pulses 40 are applied to conductive layers 28 and 32. The brightness of the displayed information will depend on the amplitude of the sustain pulses and the amount of the photopolarization by electron gun 16 and phosphor layer 36. Thus, by appropriate Z-axis timing of electron gun 16 relative to the A.C. voltage applied to conductive layers 28 and 32, the emitted light from the phosphor layer 36 will photopolarize electroluminescent layer 30 in such a manner that the created internal electric fields within electroluminescent layer 30 will add or subtract from the external field applied by A.C. source 34 thereby causing light to be emitted from the electroluminescent layer or extinquished respectively. Once the electroluminescent layer is photopolarized, it remains in either the written or ready to write state without any further action of the electron gun 16. Polarization pulse 44 can either be positive or negative.

Figure 5:
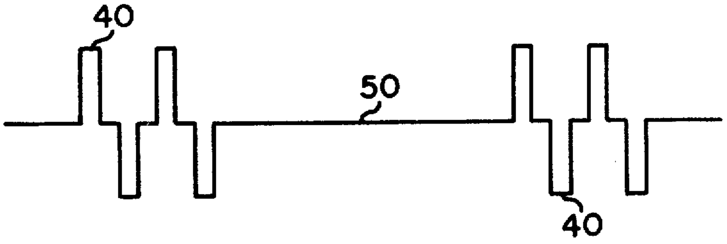
Figure 6:
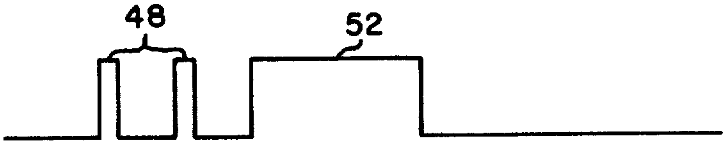

If it is desired to selectively erase information that has been stored on storage target 14, electron beam EB can be activated during the time between the positive and negative sustain pulses 40 as shown by pulses 48, FIG. 6 and directed under the control of deflection system 22 to a selected area or areas of the storage target whereby the information to be selectively erased will be erased and the remaining stored information will remain as stored information due to the presence of sustain pulses 40. If more time is needed to selectively erase stored information from storage target 14, sustain pulses 40 are discontinued as shown by 50, FIG. 5, and electron beam EB is activated as shown by 52, FIG. 6 during this time and directed to the selected area or areas of target 14. Continuation of sustain pulses 40 after selective erasure during interval 50 will cause the unerased information to remain in a stored condition.

Figure 7:
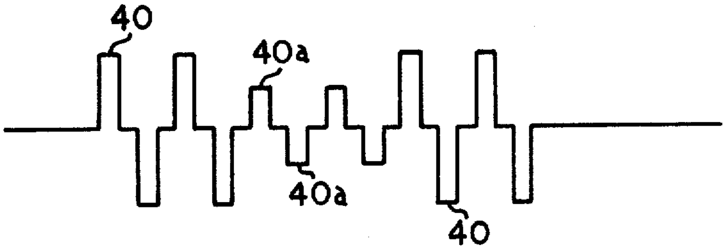

If it is desired to completely erase information stored on storage target 14, sustain pulses 40 are reduced in amplitude as shown by pulses *40a*, FIG. 7 below which luminance ceases. Sustain pulses 40 are then returned to their normal operating level whereupon target 14 has been completely erased and is in a ready to write condition.

The present storage tube displays information that is very bright and this is advantageous in a high light ambient area. The contrast ratio is 25:1 to 30:1 or better. Grey scale storage of information can be readily done by careful control of the amount of UV light reaching the electroluminescent layer and this is accomplished by control and intensity of electron beam EB. The operating life of the target is longer than that of conventional bistable storage tube targets. Selective erasure of stored information is easily accomplished. No flood guns and complicated storage targets are needed along with associated circuitry therefore.

If faceplate 24 and transparent conductor 28 are sufficiently transparent to the UV wavelengths near that optimum for photopolarization of the EL layer 30, then information may be written on the screen or information already written may be modified or added to by using a UV light pen or other means of excitation from outside the CRT that can be synchronized to control the applied AC voltage 34. This may be advantageous in correcting data or inputting information to a computer or control device by reading the information from the CRT screen via an interrogative method using electron gun 16 and target electrodes 28 and 32 in a manner similar to that used for obtaining hard copy output from conventional direct view storage CRT's.

Write-through of information can be obtained by adding visible components to phosphor layer 36 and controlling the intensity of electron beam EB and A.C. source 34.

While this invention has been particularly shown and described with reference to a preferred embodiment thereof, it will be understood by those skilled in the art that various changes in form and details may be made therein without departing from the spirit and scope of the invention.

The invention is claimed in accordance with the following:

1. In a cathode ray storage display device having an envelope, an electron gun for generating an electron beam located in one section of said envelope and a storage target in another section of said envelope for retaining thereon a pattern written by said electron beam under the control of deflection means, the improvement comprising;

a phosphor layer onto which said electron beam engages for generating a light-producing image corresponding to the pattern created by said electron beam;

an electroluminescent structure adjacent said phosphor layer including an electroluminescent layer having transparent conductive coatings on each side of said electroluminescent layer with areas of said electroluminescent layer corresponding to said light-producing image of said phosphor layer being activated to display a visible image corresponding to said light-producing image;

means for applying sustain pulses to said conductive coatings to maintain said visible image in a stored condition in said electroluminescent layer, or to place said electroluminescent layer in a ready to write state; and said electron gun being activated during intervals between said sustain pulses or during an interval when said sustain pulses are interrupted and said electron beam from said electron gun being directed under control of said deflection means to a selected area or selected areas of said storage target to selectively erase stored information therefrom.

2. The cathode ray storage display device according to claim 1 wherein said electroluminescent structure includes a layer of insulating material interposed between said transparent conductive coasting and said electroluminescent layer.

3. The cathode ray display device according to claim 1 wherein a thin layer of metal covers the surface of said phosphor layer closest to said electron gun.

4. The cathode ray display device according to claim 1 wherein said phosphor layer emits UV light in the region optimum for photopolarization of said electroluminescent layer.

5. The cathode ray display device according to claim 1 wherein said electron gun is activated to write information on said phosphor layer during the time said sustain pulses occur or during the time when a polarization pulse is generated by said applying means.

6. The cathode ray display device according to claim 1 wherein said sustain pulses are reduced to a level below which luminance ceases for completely erasing said target.

7. A method of operating a cathode ray storage display device having electron gun means, deflection means and a storage target at the display surface thereof including a phosphor layer and an electroluminescent layer, the method comprising the steps of:

operating the electron gun to generate an electron beam which is directed toward the storage target;

deflecting the electron beam over the phosphor layer to write a pattern thereon which emits light which activates corresponding areas of the electroluminescent layer to visibly display said pattern;

applying sustain pulses to said electroluminescent layer thereby causing said visible pattern to be stored by said electroluminescent layer; and operating said electron gun during the interval between said sustain pulses or when said sustain pulses are discontinued to selectively erase some of said pattern.

8. A method of operating a cathode ray storage display device according to claim 7 wherein said electron gun is operated during the time when said sustain pulses occur or when a polarization pulse is generated to write said pattern on said phosphor layer.

9. A method of operating a cathode ray storage display device according to claim 7 wherein said sustain pulses are reduced to a level below which luminance ceases thereby completely erasing said storage target.

* * * * *